United States Patent
Park

(10) Patent No.: US 11,386,950 B2
(45) Date of Patent: Jul. 12, 2022

(54) STACKED DRAM MEMORY DEVICE FOR IMPROVING INTEGRATION DENSITY AND REDUCING BIT LINE CAPACITANCE

(71) Applicant: SK hynix Inc., Icheon-si Gyeonggi-do (KR)

(72) Inventor: Kee Teok Park, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/150,854

(22) Filed: Jan. 15, 2021

(65) Prior Publication Data

US 2022/0044725 A1 Feb. 10, 2022

(30) Foreign Application Priority Data

Aug. 10, 2020 (KR) .................. 10-2020-0099974

(51) Int. Cl.
*G11C 7/12* (2006.01)
*G11C 11/4094* (2006.01)
*H01L 27/108* (2006.01)
*G11C 11/408* (2006.01)
*G11C 11/4091* (2006.01)

(52) U.S. Cl.
CPC ...... *G11C 11/4094* (2013.01); *G11C 11/4085* (2013.01); *G11C 11/4091* (2013.01); *H01L 27/10805* (2013.01); *H01L 27/10897* (2013.01); *G11C 7/12* (2013.01)

(58) Field of Classification Search
CPC ............. G11C 11/4094; G11C 11/4085; H01L 27/10805; H01L 27/10897
See application file for complete search history.

(56) References Cited

U.S. PATENT DOCUMENTS

| | | | |
|---|---|---|---|
| 9,698,272 B1* | 7/2017 | Ikeda | G11C 11/4097 |
| 10,896,722 B1* | 1/2021 | Li | G11C 11/4094 |
| 11,074,964 B1* | 7/2021 | Kawamura | G11C 5/063 |
| 2019/0295626 A1* | 9/2019 | Ikeda | G11C 11/4094 |
| 2019/0348413 A1 | 11/2019 | Beigel et al. | |
| 2021/0012828 A1* | 1/2021 | Kim | H01L 28/86 |

FOREIGN PATENT DOCUMENTS

KR 1020180005778 A 1/2018

* cited by examiner

*Primary Examiner* — Mushfique Siddique
(74) *Attorney, Agent, or Firm* — William Park & Associates Ltd.

(57) ABSTRACT

A stacked memory device includes a plurality of lower word lines extending in a first direction, a bit line positioned over the plurality of the lower word lines and extending in a second direction intersecting with the first direction, and a plurality of upper word lines positioned over the bit line and extending in the first direction. The stacked memory device also includes a plurality of lower memory cells including a lower capacitor and a lower switching element between the lower word lines and the bit line. The stacked memory device further includes a plurality of upper memory cells including an upper capacitor and an upper switching element between the bit line and the upper word lines.

20 Claims, 13 Drawing Sheets

STACKED DRAM MEMORY DEVICE FOR IMPROVING INTEGRATION DENSITY AND REDUCING BIT LINE CAPACITANCE

CROSS-REFERENCES TO RELATED APPLICATION

The present application claims priority under 35 U.S.C. § 119(a) to Korean application number 10-2020-0099974, filed on Aug. 10, 2020, in the Korean Intellectual Property Office, which is incorporated herein by reference in its entirety.

BACKGROUND

1. Technical Field

Various embodiments may generally relate to a semiconductor integrated circuit device, and more particularly, to a stacked memory device.

2. Related Art

In order to meet the performance and cost needs of consumers, the integration densities of semiconductor devices have increased. Because the integration density of a semiconductor device is an important factor for determining its cost, increased integration density is particularly important.

In a conventional two-dimensional or planar semiconductor device, the integration density may be determined by an area of a unit memory cell, so the integration density may be greatly influenced by a technology for forming a fine pattern. However, the fine pattern may be formed using expensive equipment. Thus, although the integration density of the two-dimensional semiconductor device may be increased, the integration density may be restricted by cost. Therefore, three-dimensional semiconductor devices including three-dimensionally arranged memory cells may be considered.

SUMMARY

In example embodiments of the present disclosure, a stacked memory device may include a plurality of lower word lines, a bit line, a plurality of upper word lines, a plurality of lower memory cells, and a plurality of upper memory cells. The plurality of lower word lines is extended in a first direction. The bit line is positioned over the plurality of the lower word lines and extended in a second direction intersecting with the first direction. The plurality of upper word lines is stacked over the bit line and extended in the first direction. The plurality of lower memory cells is electrically connected between the plurality of the lower word lines and the bit line. The plurality of upper memory cells is electrically connected between the plurality of the upper word lines and the bit line. Each of the plurality of lower and upper memory cells includes a transistor with a gate connected to one of the lower and upper word lines and a capacitor connected to the transistor. At least one transistor of the lower and upper memory cells is configured to have a first distance between the bit line and its gate and another transistor is configured to have a second distance between the bit line and gate of the another transistor, and the first distance is different from the second distance.

In example embodiments, the stacked memory device may further include a plurality of sub-word line drivers connected to the plurality of the lower word lines and the plurality of the upper word lines to select any one of the plurality of lower word lines and the plurality of upper word lines.

In example embodiments, the plurality of the lower word lines may correspond to the plurality of the upper word lines. The plurality of lower word lines may be substantially parallel to the plurality of upper word lines. The plurality of lower memory cells and the plurality of upper memory cells may be symmetrically folded with respect to the bit line. The stacked memory device may further include a sub-word line driver commonly connected to the lower word line and the upper word line to simultaneously select the lower word line and the upper word line.

In example embodiments, a height from the bit line to a gate of a random lower switching element may be different from a height from the bit line to gates of other adjacent lower switching elements. A height from the bit line to a gate of a random upper switching element may be different from a height from the bit line to gates of other adjacent upper switching elements.

In example embodiments, the gate of the random lower switching element may be spaced apart from a bottom surface of the bit line by a first height. The gates of the other adjacent lower switching elements may be spaced apart from the bottom surface of the bit line by a second height different from the first height. The gate of the upper switching element facing the random lower switching element may be spaced apart from an upper surface of the bit line by the second height. The gates of the other upper switching elements, which may be adjacent to the facing upper switching element and connected to a same upper word line, may be spaced apart from the upper surface of the bit line by the first height.

In example embodiments of the present disclosure, a stacked memory device may include a first memory array layer and a second memory array layer. The first memory array layer may include a first bit line, a plurality of lower memory cells, and a plurality of upper memory cells. The plurality of the lower memory cells may be connected to an upper surface of the first bit line. The plurality of the upper memory cells may be connected to a lower surface of the first bit line. The second memory array layer may be stacked on the first memory array layer. The second memory array layer may include a second bit line, a plurality of lower memory cells, and a plurality of upper memory cells. The plurality of the lower memory cells may be connected to an upper surface of the first bit line. The plurality of the upper memory cells may be connected to a lower surface of the first bit line. The first bit line and the second bit line may extend parallel to each other.

In example embodiments, each of the lower switching element and the upper switching element may include a pillar, a gate and a source/drain. The pillar may extend in a stack direction of the second memory array layer. The gate may be configured to surround the pillar. The source/drain may be formed in the pillar at both sides of the gate. The lower switching element connected to a same lower word line or the upper switching element connected to a same upper word line may have a drain length different from a drain length of the other adjacent lower switching element or the other adjacent upper switching element.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments. However, these embodiments should not be construed as limiting the concept of the present teachings. Although a few embodiments of the present teachings will be shown and described, it will be appreciated by those of ordinary skill in the art that changes may be made in these embodiments without departing from the principles and spirit of the present teachings.

Figure 1A:
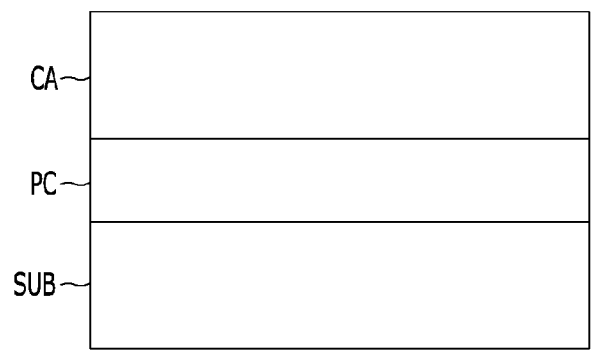
FIGS. 1A and 1B are block diagrams illustrating a semiconductor memory device in accordance with example embodiments.
Figure 1B:
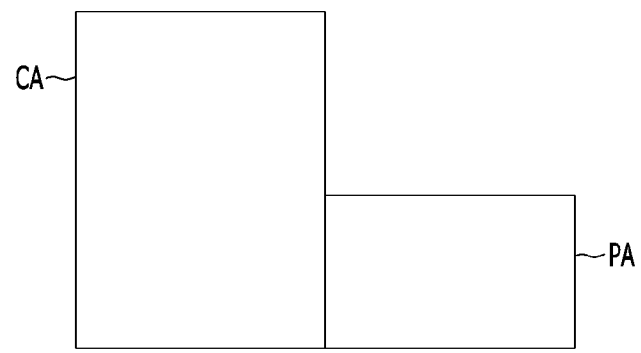

FIGS. 1A and 1B are block diagrams illustrating a semiconductor memory device in accordance with example embodiments.

Referring to FIGS. 1A and 1B, the semiconductor memory device may include a peripheral circuit region PC and a cell array CA arranged on a substrate SUB.

The substrate SB may include a single crystalline semiconductor layer. For example, the substrate SUB may include a bulk silicon substrate, a silicon-on-insulator substrate, a germanium substrate, an epitaxial layer formed by a selective epitaxial growth process, etc.

The cell array CA may include a plurality of memory cells. Each of the memory cells may include one switching element and one storage element. In example embodiments, the memory cells may include a DRAM memory cell using a capacitor as the storage element.

The peripheral circuit region PC may include circuit elements for performing memory operations of the cell array CA.

As shown in FIG. 1A, the semiconductor memory device may include the peripheral circuit region PC on the substrate SUB and the cell array CA stacked on the peripheral circuit region PC. The peripheral circuit region PC may be overlapped with the cell array CA to reduce an occupying area of the cell array CA and the peripheral circuit region PC on the substrate SUB.

As shown in FIG. 1B, the semiconductor memory device may include the cell array CA and the peripheral circuit region PC adjacent to each other on the substrate SUB.

Figure 2:
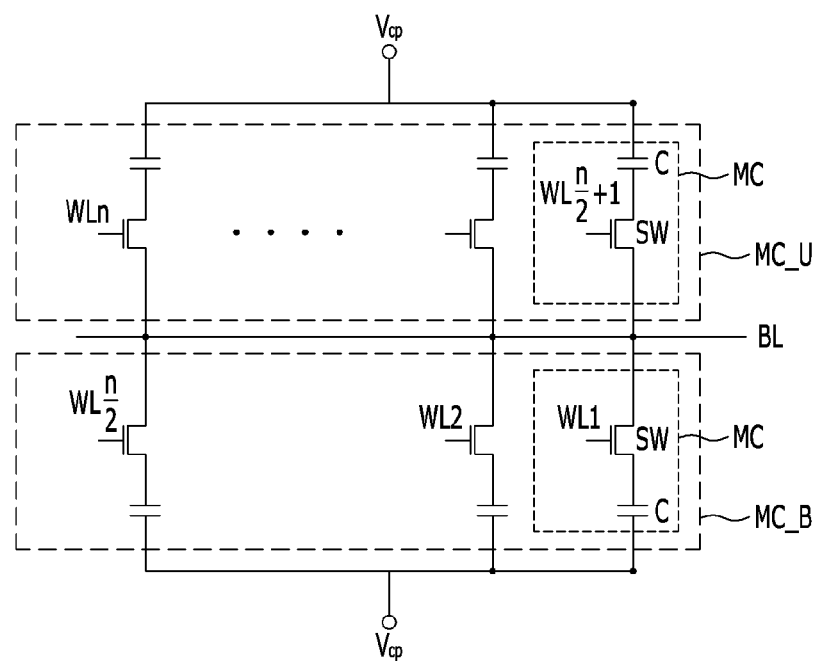
FIG. 2 is a circuit diagram illustrating a stacked memory device in accordance with example embodiments.

FIG. 2 is a circuit diagram illustrating a stacked memory device in accordance with example embodiments. In FIG. 2, a memory array may include memory cells between one bit line and a plurality of word lines.

Referring to FIG. 2, the memory array layer may include a plurality of the memory cells MC positioned over and under the bit line BL. For example, when n number of memory cells are connected to one bit line BL in one memory array layer CA, a first word line WL1 to a (n/2)th word line WLn/2 may be positioned under the bit line BL. A (n/2+1)th word line WLn/2+1 to an nth word line WLn may be positioned over the bit line BL. Thus, the memory cells MC may be formed at intersection points between the bit line BL and the first word line WL1 to the (n/2)th word line WLn/2, and the bit lines BL and the (n/2+1)th word line WLn/2+1 to the nth word line WLn. In the drawings, MC_B may indicate the memory cells under the bit line BL and MC_U may indicate the memory cells over the bit line BL.

Each of the memory cells MC may include a switching element SW and a capacitor C. The switching element SW may include a transistor. The transistor may include a gate connected to the word line (any one of WL1~WLn), a drain connected to the bit line BL, and a source connected to the capacitor C. The capacitor C may be connected between the switching element SW and a capacitor voltage terminal $V_{CP}$. The capacitor C may include a storage electrode, a dielectric layer, and a plate electrode. The storage electrode may be electrically connected to the drain of the switching element SW. The plate electrode may be electrically connected to the capacitor voltage terminal $V_{CP}$.

The memory cells MC_B under the bit line BL and the memory cells MC_U over the bit line BL may be symmetrically folded with respect to the bit line BL.

Figure 3:
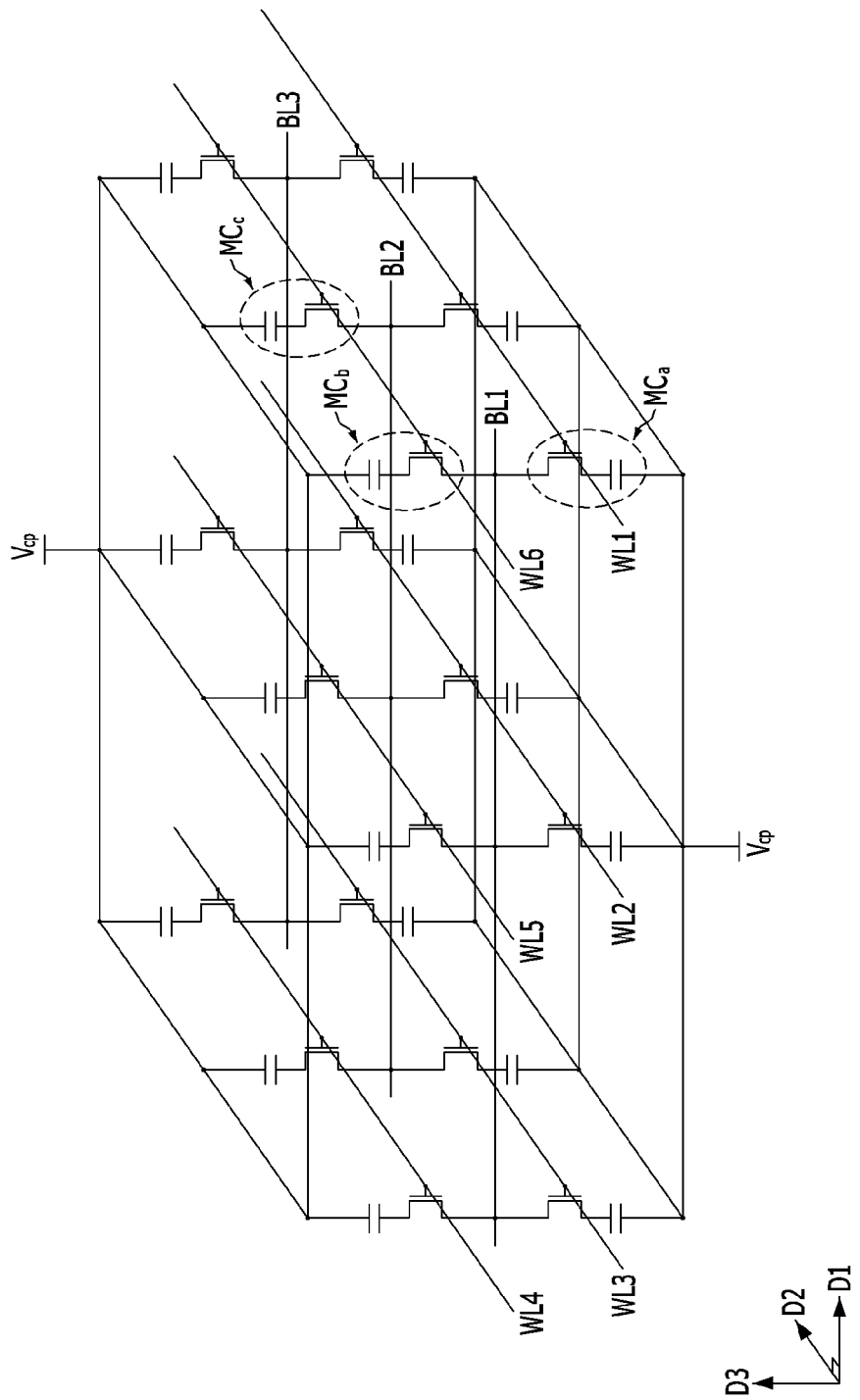
FIG. 3 is a circuit diagram illustrating a stacked memory device in accordance with example embodiments.

FIG. 3 is a circuit diagram illustrating a stacked memory device in accordance with example embodiments. For convenience of explanation, the stacked memory device is shown to include three bit lines and six word lines. Different numbers of bit lines and/or word lines may be present in different embodiments.

Referring to FIG. 3, first to third bit lines BL1~BL3 may extend in a first direction D1. The first to third bit lines BL1~BL3 may be parallel to each other. Further, the first to third bit lines BL1~BL3 may be spaced apart from each other by a uniform gap. First to sixth word lines WL1~WL6 may extend in a second direction D2 intersecting with the first direction D1. For an embodiment, intersecting directions means the directions are not parallel to one another. For another embodiment, intersecting directions means the directions are perpendicular to one another. The first to sixth word lines WL1~WL6 may be parallel to each other. Further, the first to sixth word lines WL1~WL6 may be spaced apart from each other by a uniform gap. For example, the first to third word lines WL1~WL3 may be positioned under the first to third bit lines BL1~BL3. The fourth to sixth word lines WL4~WL6 may be positioned over the first to third bit lines BL1~BL3. That is, the fourth to sixth word lines WL4~WL6 may be arranged at a position spaced apart from the first to third word lines WL1~WL3 in a third direction D3. Further, the word lines WL1~WL3 under the bit line BL and the word lines WL4~WL6 over the bit line BL may extend to face to each other.

The memory cells MC may be located at intersection points between the first to third bit lines BL1~BL3 and the first to sixth word lines WL1~WL6.

For example, a first memory cell MCa connected between the first bit line BL1 and the first word line WL1 and a second memory cell MCb connected between the first bit line BL1 and the sixth word line WL6 may be commonly connected to the first bit line BL1. During a memory operation such as a write operation and a read operation, any one of the first memory cell MCa and the second memory cell MCb may be selected in accordance with enabling of the first word line WL1 or the sixth word line WL6. In order to select any one of the memory cells connected one bit line BL, the first to sixth word lines WL1~WL6 may be connected to a sub-word line driver (not shown). Connections between the word lines WL1~WL6 and the sub-word line driver are described later. When the first word line WL1 and the sixth word line WL6 are commonly connected to one sub-word line driver, the first memory cell MCa and the second memory cell MCb may be simultaneously selected. When the second memory cell MCb is selected, a third memory cell MCc connected between the sixth word line WL6 and the second bit line BL2 might not perform the memory operation because a voltage might not be applied to the second bit line BL.

Further, although not depicted in the drawings, each of the bit lines BL1~BL3 may be electrically connected with a columnar control circuit in the peripheral circuit region PC in FIGS. 1A and 1B such as a sense amplifier. The sub-word line driver may also be arranged in the peripheral circuit region PC.

Figure 4:
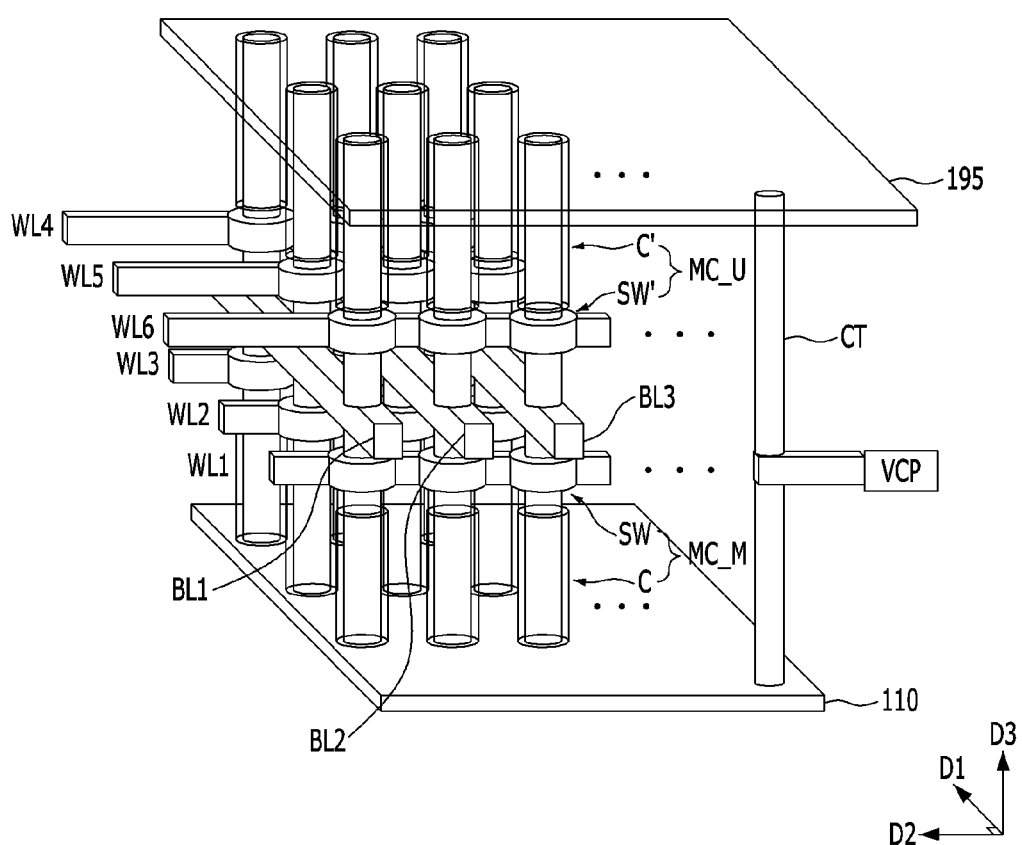
FIG. 4 is a perspective view illustrating a stacked memory device in accordance with example embodiments.
Figure 5:
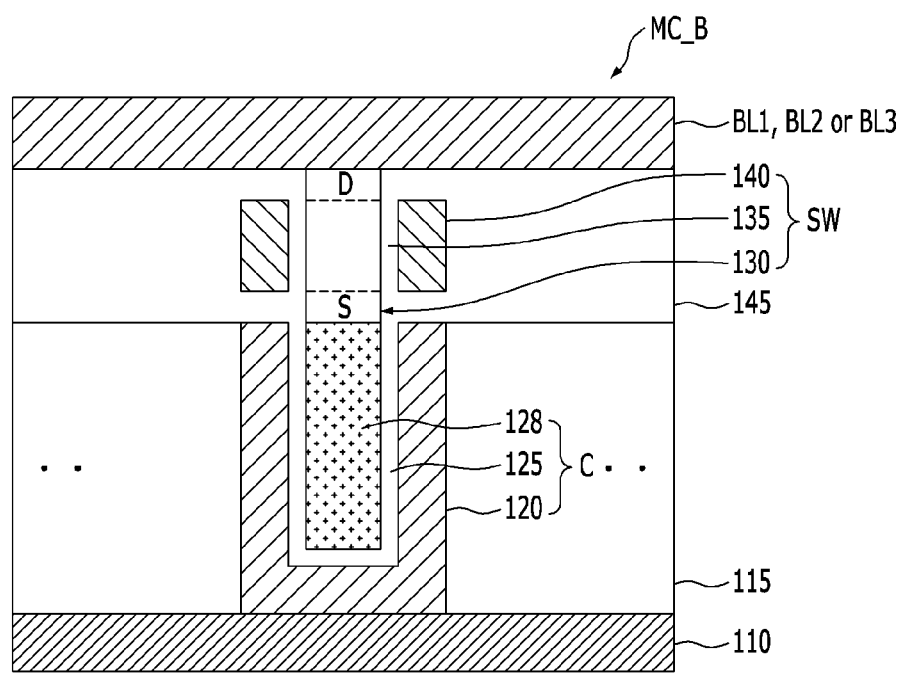
FIG. 5 is a cross-sectional view illustrating a lower memory cell of a stacked memory device in accordance with example embodiments.
Figure 5:
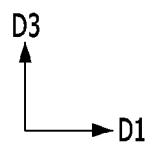
Figure 6:
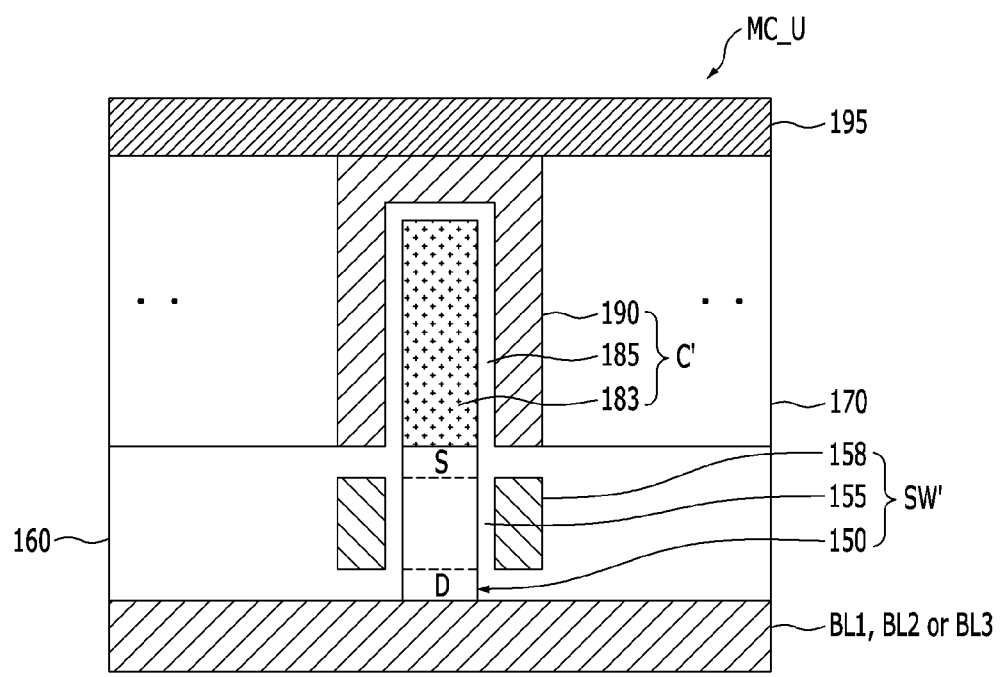
FIG. 6 is a cross-sectional view illustrating an upper memory cell of a stacked memory device in accordance with example embodiments.
Figure 6:
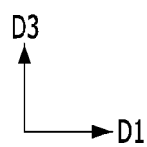

FIG. 4 is a perspective view illustrating a stacked memory device in accordance with example embodiments, FIG. 5 is a cross-sectional view illustrating a lower memory cell of a stacked memory device in accordance with example embodiments, and FIG. 6 is a cross-sectional view illustrating an upper memory cell of a stacked memory device in accordance with example embodiments.

Referring to FIGS. 4, 5, and 6, the lower memory cells MC_B may be arranged over a lower plate wiring 110 in a matrix shape. The lower plate wiring 110 may be formed on a semiconductor substrate. An underlying layer (not shown) may be interposed between the lower plate wiring 110 and the semiconductor substrate (not shown). The underlying layer may include a plurality of conductive layers, a plurality of insulation layers, and various circuit elements. When the stacked memory device has the structure in FIG. 1A, the underlying layer may include the peripheral circuit region PC.

Each of the lower memory cells MC_B may include a capacitor C and a switching element SW (hereinafter, referred to as a lower switching element). As shown in FIG. 5, the capacitor C may include a plate electrode 120, a dielectric layer 125, and a storage electrode 128. The capacitor C may be formed in a first insulating interlayer 115 on the lower plate wiring 110. The capacitor C may be electrically connected to other adjacent capacitors C.

For example, the plate electrode 120 of the capacitor C in the lower memory cell MC_B may have a cylindrical shape having an opened upper surface. The dielectric layer 125 may be formed on an inner surface of the plate electrode 120. The storage electrode 128 may be formed on the dielectric layer 125 to fill up an internal space of the cylindrical plate electrode 120. The plate electrode 120 and the storage electrode 128 may include a polysilicon layer doped with impurities, not restricted within a specific layer. Thus, the plate electrode 120 and the storage electrode 128 may include various conductive layers.

The lower switching element SW may be formed on the capacitor C. The lower switching element SW may be electrically connected with the storage electrode 128. For example, the lower switching element SW may include a transistor having a vertical channel. The vertical channel may function so as to generate a current path in the third direction D3. For example, the lower switching element SW may include a gate all around (GAA) type transistor.

The lower switching element SW may include a pillar 130 and a gate 140 configured to surround the pillar 130.

The pillar 130 may extend from the storage electrode 128 in the third direction D3. For example, the pillar 130 may include a semiconductor material for selectively generating a channel in accordance with an external electric field. A lower region and an upper region of the pillar 130 may be heavily doped with impurities to define a source S and a drain D.

The gate 140 may have an annular shape configured to surround a portion of the pillar 130 between the source S and the drain D. The gate 140 may be electrically connected to a gate of the lower switching element SW connected to another adjacent bit line BL in the second direction D2 to form the word lines WL1~WL3. The gate 140 may include a polysilicon layer doped with conductive impurities, a metal layer, etc. The word lines WL1~WL3 may be electrically connected with a first level of a word line driver in the peripheral circuit region. A gate insulation layer 135 may be interposed between the pillar 130 and the gate 140.

A second insulating interlayer 145 may be formed between the lower switching elements SW to electrically isolate the adjacent lower switching elements SW from each other.

The bit lines BL1~BL3 may extend on the second insulating interlayer 145 in the first direction D1. The bit lines BL1~BL3 may be electrically connected to a drain D of the lower switching element SW under the bit lines BL1~BL3. Further, ends of the bit lines BL1~BL3 may be electrically connected to a sense amplifier formed in the peripheral circuit region.

As shown in FIG. 6, the upper memory cells MC_U may be formed on the bit lines BL in a matrix shape. Each of the upper memory cells MC_U may include a capacitor C' and a switching element SW' (hereinafter, referred to as an upper switching element). In order to symmetrically fold the upper memory cell MC_U and the lower memory cell MC_B with respect to the bit line BL, the upper switching element SW' and the capacitor C' may be sequentially stacked on the bit line BL.

The upper switching element SW' may include a pillar 150 and a gate 158 similarly to the lower switching element SW of the lower memory cell MC_B. The pillar 150 may extend from a selected region of the bit line BL in the third direction D3. A lower region and an upper region of the pillar 150 may be heavily or highly doped with impurities to form a drain D and a source S. The gate 158 may have an annular shape configured to surround the pillar 150 between the source S and the drain D. The gate 158 of the upper switching element SW' may be electrically connected to a gate 158 of the upper switching element SW' connected to other adjacent bit line BL in the second direction D2 to form the word lines WL4~WL6. A gate insulation layer 155 may be interposed between the pillar 150 and the gate 158.

A third insulating interlayer 160 may be formed between the upper switching elements SW' to electrically isolate the adjacent upper switching elements SW' from each other.

The capacitor C' may include a storage electrode 183, a dielectric layer 185 and a plate electrode 190 similarly to the capacitor C of the lower memory cell MC_B. The plate electrode 190 of the capacitor C' may have a shape symmetrically arranged between the plate electrode 120 of the capacitor C and the bit lines BL1~BL3. The storage electrode 183 of the capacitor C' may have a cylindrical shape extended from the source S of the pillar 150. The dielectric layer 185 may be formed on an exposed surface of the storage electrode 183. Thus, the plate electrode 190 may have a cylindrical shape having an opened lower surface. A fourth insulating interlayer 170 may be interposed between the capacitors C' to electrically isolate the adjacent capacitors C' from each other. An upper plate wiring 195 may be formed on the fourth insulating interlayer 170 and the plate electrode 190.

The upper plate wiring 195 and the lower plate wiring 110 may be electrically connected with each other via a contact CT as shown in FIG. 4. The contact CT may be partially drawn to be electrically connected with the capacitor voltage terminal $V_{CP}$.

Figure 7:
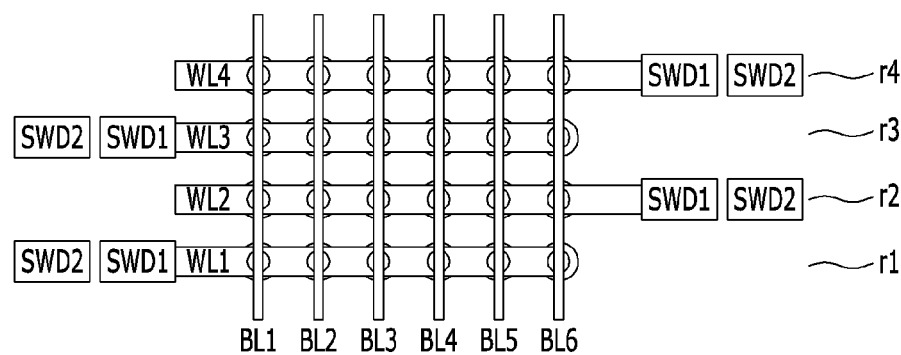
FIG. 7 is a plan view illustrating a connection between lower word lines and a sub-word line driver in accordance with example embodiments.
Figure 8:
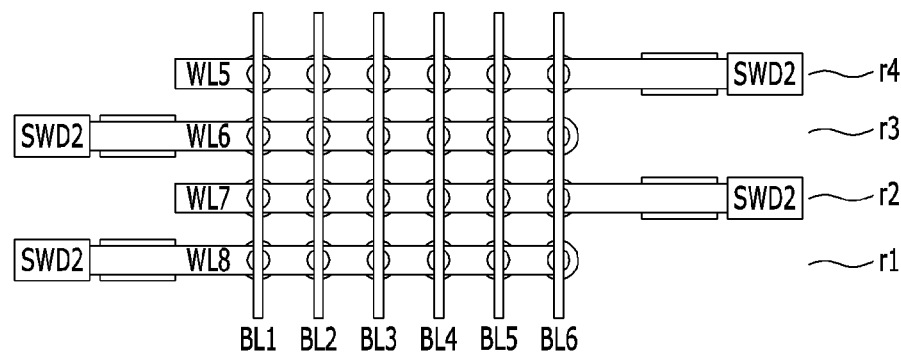
FIG. 8 is a plan view illustrating a connection between upper word lines and a sub-word line driver in accordance with example embodiments.

FIG. 7 is a plan view illustrating a connection between lower word lines and a sub-word line driver in accordance with example embodiments, and FIG. 8 is a plan view illustrating a connection between upper word lines and a sub-word line driver in accordance with example embodiments. In FIGS. 7 and 8, for convenience of explanation, a stacked memory device may include six bit lines BL1~BL6 and eight word lines WL1~WL8. The eight word lines WL1~WL8 may be divided into two groups of four word lines based on the bit lines BL1~BL6.

Referring to FIG. 7, first to fourth word lines WL1~WL4 may be arranged over the bit lines BL1~BL6. Each of the first to fourth word lines WL1~WL4 may be connected to a first level of sub-word line drivers SWD1. In order to improve arrangement efficiency, the first level of the sub-word line drivers SWD1 connected to the first and third word lines WL1 and WL3 may be arranged at one edge of the first and third word lines WL1 and WL3. The first level of the sub-word line drivers SWD1 connected to the second and fourth word lines WL2 and WL4 may be arranged at the other edge of the second and fourth word lines WL2 and WL4.

Referring to FIG. 8, fifth to eighth word lines WL5~WL8 may be arranged over the bit lines BL1~BL6. The fifth to eighth word lines WL5~WL8 may be overlapped with the first to fourth word lines WL1~WL4. Each of the fifth to eighth word lines WL5~WL8 may be connected to a second level of sub-word line drivers SWD2. In order to improve arrangement efficiency, the second level of the sub-word line drivers SWD2 connected to the sixth and eighth word lines WL6 and WL8 may be arranged at one edge of the sixth and eighth word lines WL6 and WL8. The second level of the sub-word line drivers SWD2 connected to the fifth and seventh word lines WL5 and WL7 may be arranged at the other edge of the fifth and seventh word lines WL5 and WL7.

The second level of the sub-word line drivers SWD2 may be arranged outside the first level of the sub-word line drivers SWD1. The fifth to eighth word lines WL5~WL8 may have a length longer than a length of the first to fourth word lines WL1~WL4 so that the fifth to eighth word lines WL5~WL8 may be connected to the second level of the sub-word line drivers SWD2. For example, the word line drivers SWD2 connected to different word lines may be selectively driven in accordance with a row address.

For example, the first level of the sub-word line driver SWD1 and the second level of the sub-word line driver SWD2 may be positioned on a same plane or different planes. As shown in FIG. 1A, the first level of the sub-word line driver SWD1 and the second level of the sub-word line driver SWD2 may be arranged in the peripheral circuit region PC under the memory array. The first level of the sub-word line driver SWD1 and the second level of the sub-word line driver SWD2 may be electrically connected to a corresponding word line through a vertical contact.

Although the first and second levels of the sub-word line drivers SWD1 and SWD2 may have the same name, the first and second levels of the sub-word line drivers SWD1 and SWD2 may be configured to select any one of the first to eighth word lines WL1~WL8 in accordance with different control signals.

Referring to FIGS. 1 to 8, the stacked memory device may include the memory cells, which may be connected to one bit line, divided into the upper memory cells on an upper plane and the lower memory cells on a lower plane. Thus, the bit line may have a reduced length by about 50%. By reducing the length of the bit line, a capacitance of the bit line for determining a DRAM device may be decreased to improve signal transmission characteristics and storage characteristics. Further, when the length of the bit line is maintained as a conventional length, 2n number of the memory cells may be connected to one bit line to improve an integration density by about 200%.

Figure 9A:
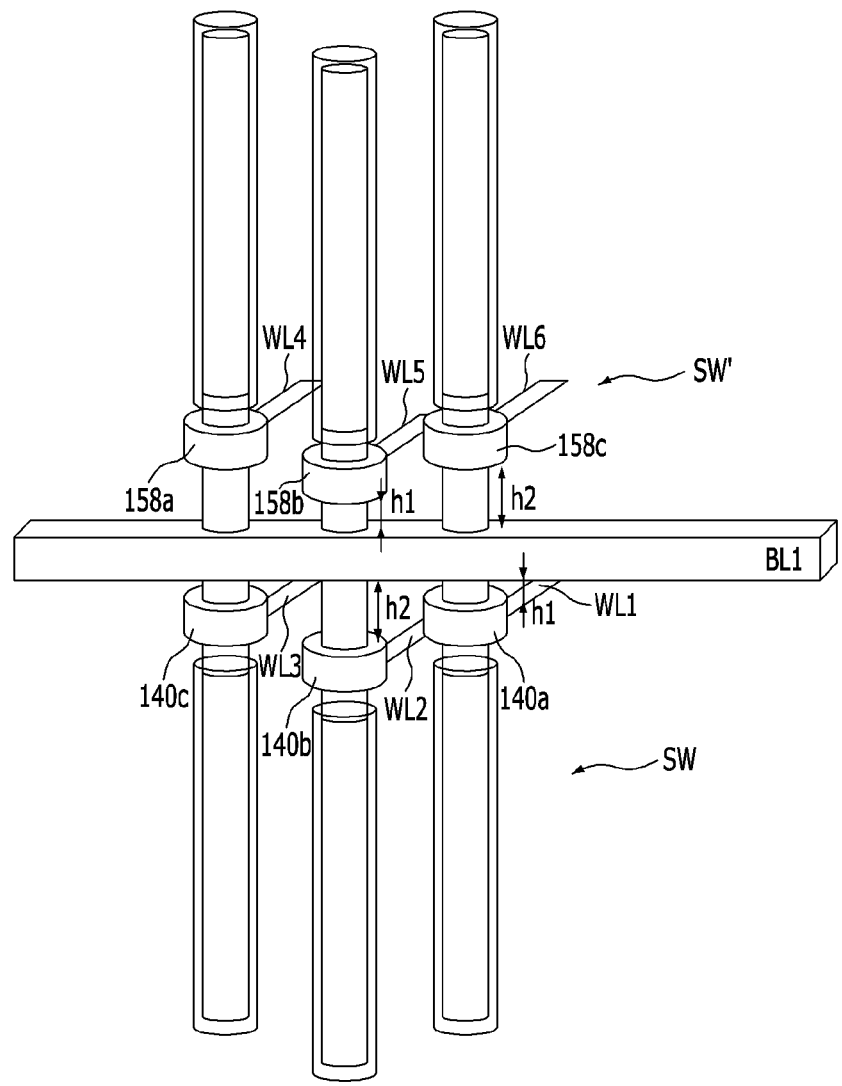
FIGS. 9A and 9B are perspective views illustrating a stacked memory device in accordance with example embodiments.
Figure 9B:
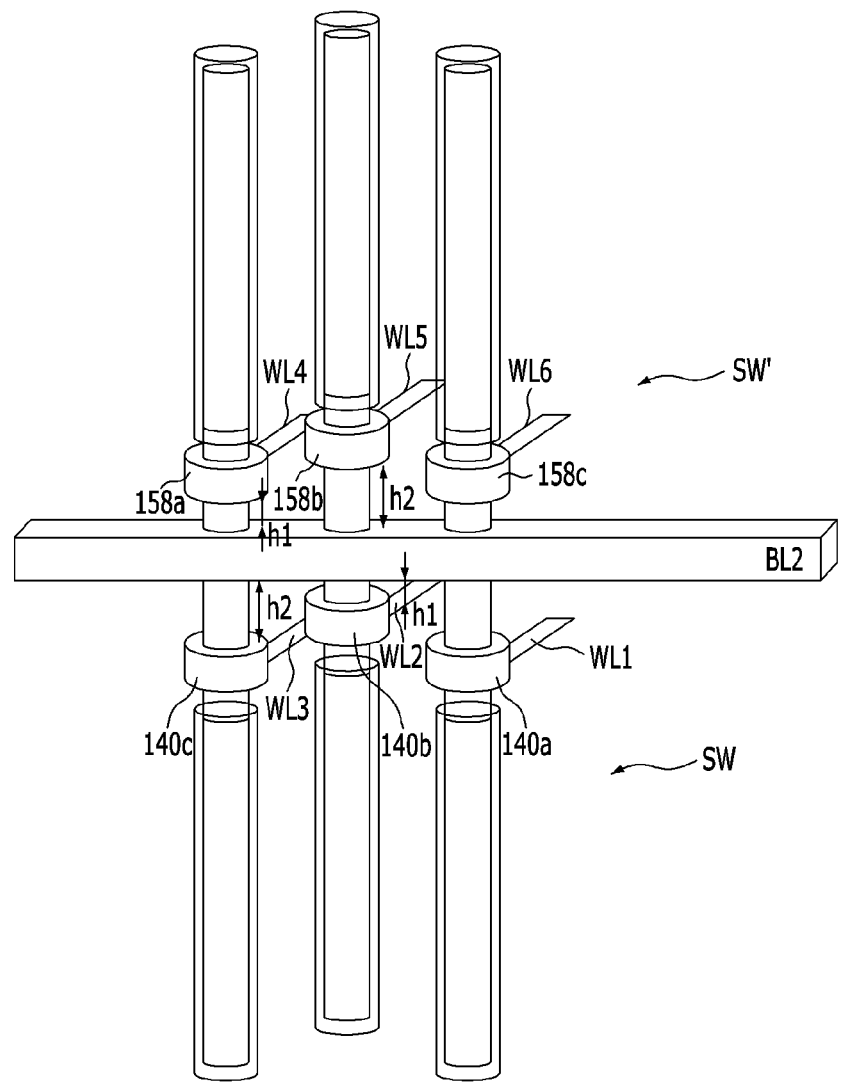
Figure 10:
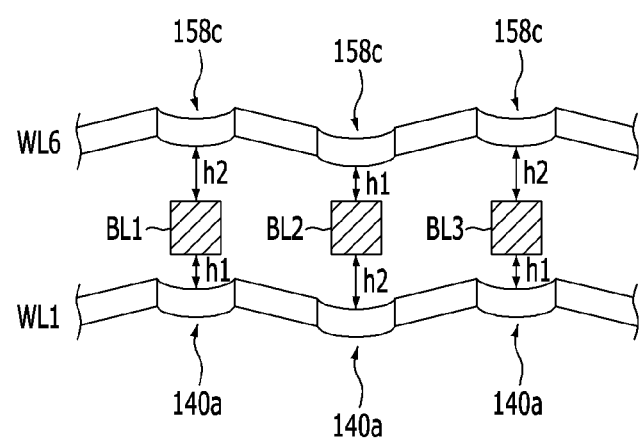
FIG. 10 is a cross-sectional view illustrating a stacked memory device taken along an extending direction of a word line in accordance with example embodiments.

FIGS. 9A and 9B are perspective views illustrating a stacked memory device in accordance with example embodiments. FIG. 10 is a cross-sectional view illustrating a stacked memory device taken along a direction in which a word line extends in accordance with example embodiments. For example, FIG. 10 shows first and sixth word lines WL1 and WL6.

Referring to FIG. 9A, gates 140a and 140c may be positioned under the first bit line BL1. The gates 140a and 140c may be connected to the first and third word lines WL1 and WL3. The gates 140a and 140c may be spaced apart from a bottom surface of the first bit line BL1 by a first height h1. A gate 140b may be positioned under the first bit line BL1. The gate 140b may be connected to the second word line WL2. The gate 140b may be spaced apart from the bottom surface of the first bit line BL1 by a second height h2 greater than the first height h1. The gates 140a, 140b, and 140c of the switching elements SW under the first bit line BL1 may have heights different from heights of the gates 140a, 140b, and 140c of an adjacent switching element SW.

Gates 158a and 158c may be positioned over the first bit line BL1. The gates 158a and 158c may be connected to the fourth and sixth word lines WL4 and WL6. The gates 158a and 158c may be spaced apart from an upper surface of the first bit line BL1 by the second height h2. A gate 158b may be positioned under the first bit line BL1. The gate 158b may be connected to the fifth word line WL5. The gate 158b may be spaced apart from the upper surface of the first bit line BL1 by the first height h1. The gates 158a, 158b, and 158c of the switching elements SW' over the first bit line BL1 may have heights different from heights of the gates 158a, 158b, and 158c of an adjacent switching element SW'.

When the gate 140a or 140c of the lower switching element SW has the height h1, the gate 158c or 158a of the upper switching element SW' corresponding to the gates 140a or 140c of the lower switching element SW may have the second height h2. When the gate 140b of the lower switching element SW has the height h2, the gate 158b of the upper switching element SW' corresponding to the gate 140b of the lower switching element SW may have the first height h1.

A length between the first bit line BL1 and the gate 140 or 158, i.e., the first height h1 or the second height h2 may correspond to a drain length of the switching elements SW and SW'. Thus, the drain length of the lower or upper switching element SW or SW' connected to the same lower or upper word lines WL1~WL6 may be different from a drain length of another adjacent lower or upper switching element.

Referring to FIG. 9B, in the second bit line BL2 adjacent to the first bit line BL1, the gate 140b among the lower switching elements SW connected to the second word line WL2 may be spaced apart from the second bit line BL2 by the first height h1. The gates 140a and 140c connected to the first and third word lines WL1 and WL3 may be spaced apart from a bottom surface of the second bit line BL2 by the second height h2.

Further, the gates 158a and 158c connected to the fourth and sixth word lines WL4 and WL6 among the upper switching elements SW', which may be connected to the second bit line BL2, may be spaced apart from an upper surface of the second bit line BL2 by the first height h1. The gate 158b connected to the fifth word line WL5 may be spaced apart from the second bit line BL2 by the second height h2.

As a result, as shown in FIG. 10, the word lines WL1 and WL6 may be arranged in a zigzag shape to have height differences with respect to the bit lines BL1, BL2, and BL3. Therefore, although the GAA type gate may be formed, a sufficient wiring margin may be secured.

Figure 11:
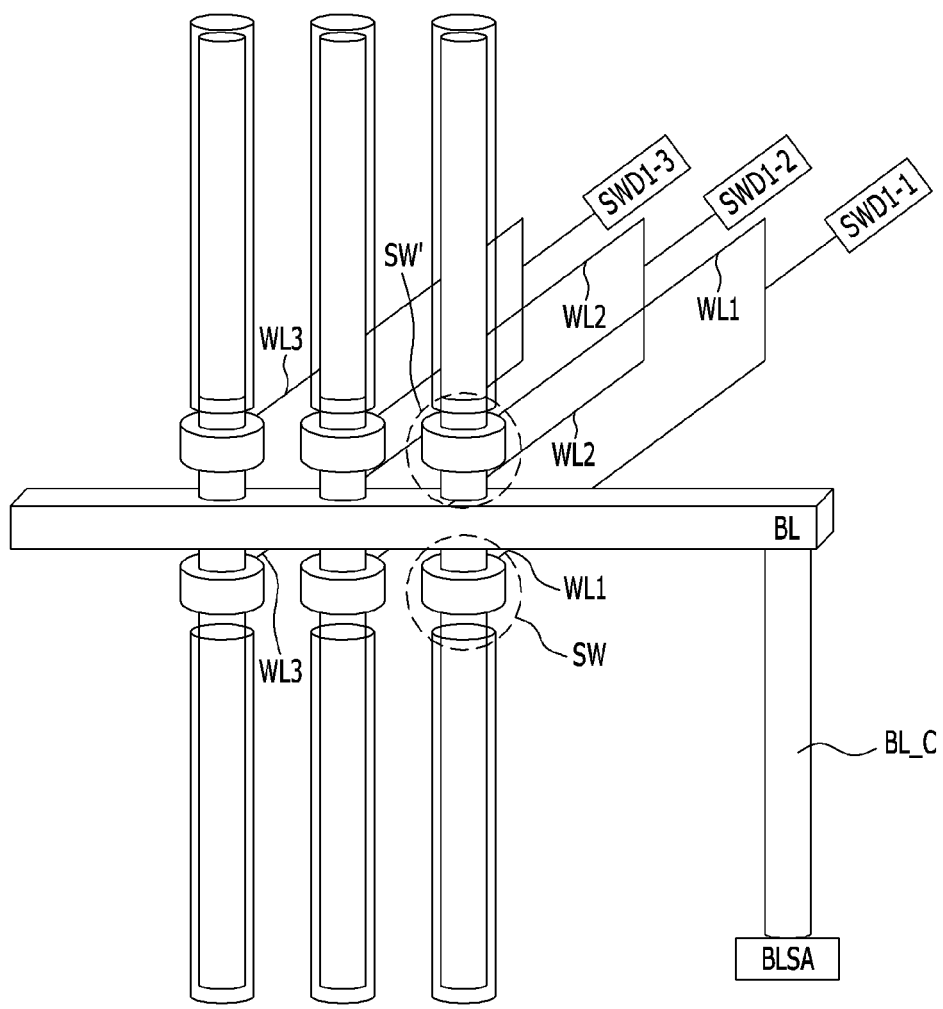
FIG. 11 is a perspective view illustrating a stacked memory device in accordance with example embodiments.
Figure 12:
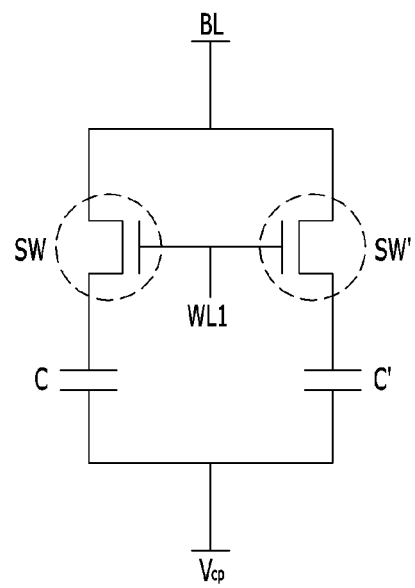
FIG. 12 is an equivalent circuit diagram illustrating a memory cell of the stacked memory device in FIG. 11.

FIG. 11 is a perspective view illustrating a stacked memory device in accordance with example embodiments, and FIG. 12 is an equivalent circuit diagram illustrating a memory cell of the stacked memory device in FIG. 11.

Referring to FIG. 11, the upper and lower word lines facing to each other with respect to the bit line BL may be connected to one sub-word line driver SWD in common. For example, the first word line WL1 under the bit line BL and the first word line WL1 over the bit line BL may be connected to a first word line driver SWD1-1 in common. The second word line WL2 under the bit line BL and the second word line WL2 over the bit line BL may be commonly connected to a second word line driver SWD1-2. The third word line WL3 under the bit line BL and the third word line WL3 over the bit line BL may be commonly connected to a third word line driver SWD1-3.

For example, when a selection signal is outputted from the first word line driver SWD1-1, the upper and lower first word lines WL1 may be simultaneously enabled. By enabling the upper and lower first word lines WL1, the upper and lower switching elements SW and SW' connected to the upper and lower first word lines WL1 may be simultaneously turned-on.

In FIG. 11, a reference numeral BL_C may indicate a contact configured to connect the bit line BL with a circuit in the peripheral circuit region PC, for example, a contact configured to electrically connect the bit line BL with the sense amplifier BLSA or a column switch (not shown). A plurality of the contacts BL_C may be provided to one bit line BL. Each of the contacts BL_C may include a single conductive layer or stacked conductive layers.

Thus, as shown in FIG. 12, the stacked memory device may include the upper and lower capacitors C and C' connected in parallel with each other between the bit line BL and the capacitor voltage terminal $V_{CP}$. As a result, the memory cell may have improved capacitance. For example, the memory cell may achieve a desired capacitance without increasing capacitor height.

Figure 13:
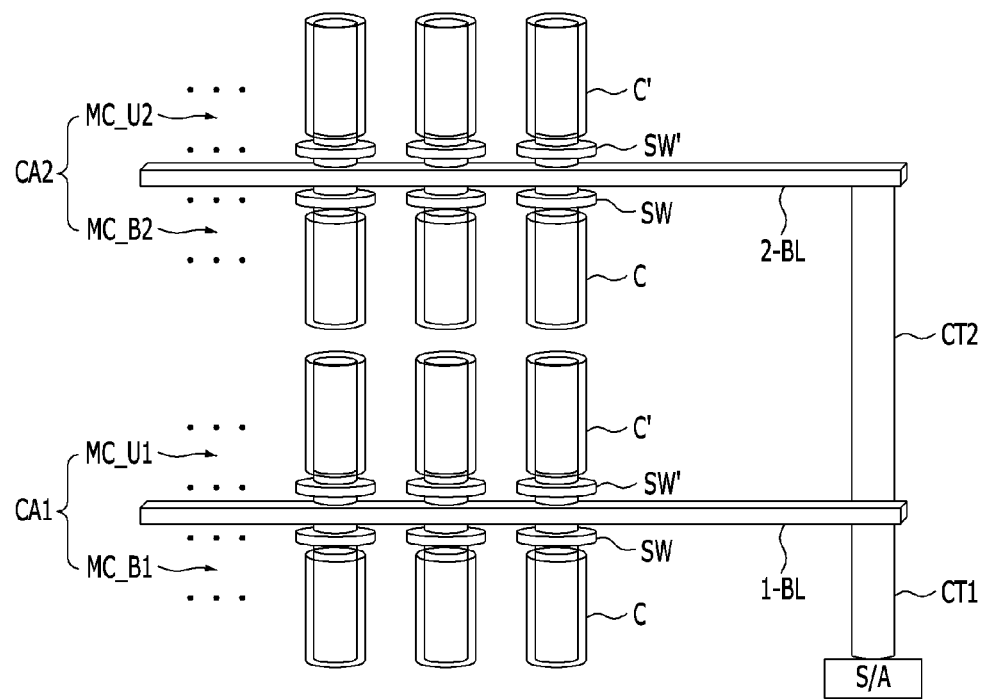
FIG. 13 is a perspective view illustrating a stacked memory device in accordance with example embodiments.

FIG. 13 is a perspective view illustrating a stacked memory device in accordance with example embodiments.

Referring to FIG. 13, a second memory array layer CA2 may be stacked on a first memory array layer CA1. The first memory array layer CA1 may include a first level of a bit line 1-BL connected to lower memory cells MC_B1 and upper memory cells MC_U1. The second memory array layer CA2 may include a second level of a bit line 2-BL connected to lower memory cells MC_B2 and the upper memory cells MC_U2.

For example, the first level of the bit line 1-BL and the second level of the bit line 2-BL may be electrically connected with a sense amplifier S/A through a plurality of contacts CT1 and CT2.

Therefore, at least two memory array layers (e.g., CA1 and CA2) may be stacked to improve the capacity of a memory device.

Figure 14:
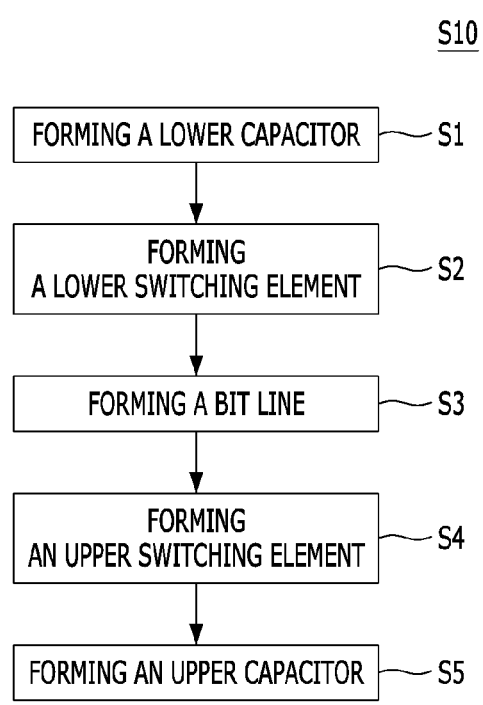
FIG. 14 is a flow chart illustrating a method of manufacturing a memory array of a stacked memory device in accordance with example embodiments.

FIG. 14 is a flow chart illustrating a method S10 of manufacturing a memory cell array of a stacked memory device in accordance with example embodiments.

Referring to FIG. 14, the method for manufacturing the memory array of the stack memory device S10 may include a step S1 for forming a lower capacitor C on a semiconductor substrate. The lower capacitor C may be formed in various shapes, by various procedures, and of various materials. Although not depicted in the drawings, the step S10 may further include forming a peripheral circuit before forming the lower capacitor C.

After forming the lower capacitor C, in step S2, a lower switching element SW may be formed on the lower capacitor C. The lower switching element SW may be electrically connected to the lower capacitor C. The lower switching element SW may include a transistor having a vertical channel. The lower switching element SW may be formed in various shapes by traditional or novel means.

After forming the lower switching element SW, in step S3, a bit line BL may be formed on the lower switching element SW. The bit line BL may be electrically connected to the lower switching element SW.

After forming the bit line BL, in step S4, an upper switching element SW' may be formed on the bit line BL. The upper switching element SW' may be electrically connected to the bit line BL. The upper switching element SW' may include a transistor having a vertical channel similarly to the lower switching element SW. The upper switching element SW' and the lower switching element SW may be symmetrical with each other and with respect to the bit line BL.

In step S5, an upper capacitor C' may be formed on the upper switching element SW'. The upper capacitor C' may be electrically connected to the upper switching element SW'. The upper capacitor C' may be symmetrical with the lower capacitor C. In this way, one memory array layer of the stacked memory device may be completed. The above-indicated steps for forming a memory array layer may be repeated at least once to complete additional memory array layers of a stacked memory device.

According to example embodiments, a plurality of upper word lines may be arranged over a plurality of bit lines and a plurality of lower word lines may be arranged under the plurality of bit lines to form a plurality of DRAM memory cells at intersection points between the plurality of bit lines and the plurality of lower and upper word lines. Integration density may be improved and the capacitance of the bit may be reduced to improve memory capacity.

The embodiments described above are intended to illustrate and not to limit the present teachings. Various alternatives and equivalents are possible. The present teachings are not limited by the embodiments described herein. Nor are the present teachings limited to any specific type of semiconductor device. Other additions, subtractions, or modifications are possible in view of the present disclosure and are intended to fall within the scope of the appended claims.

What is claimed is:

1. A stacked memory device comprising:
a plurality of lower word lines extending in a first direction;
a bit line positioned over the plurality of the lower word lines and extending in a second direction intersecting with the first direction;
a plurality of upper word lines stacked over the bit line and extending in the first direction;
a plurality of lower memory cells electrically connected between the plurality of lower word lines and the bit line; and
a plurality of upper memory cells electrically connected between the plurality of upper word lines and the bit line,
wherein each of the plurality of lower and upper memory cells includes a transistor with a gate connected to one of the lower and upper word lines and a capacitor connected to the transistor, and
wherein at least one transistor of the lower and upper memory cells is configured to have a first distance between the bit line and its gate and another transistor is configured to have a second distance between the bit line and gate of the another transistor, and the first distance is different from the second distance.

2. The stacked memory device of claim 1, further comprising a plurality of sub-word line drivers connected to the plurality of lower word lines and the plurality of upper word lines to select any one of the plurality of the lower word lines and the plurality of the upper word lines.

3. The stacked memory device of claim 1, wherein the lower word lines and upper word lines are arranged to face each other with respect to the bit line.

4. The stacked memory device of claim 3, further comprising a sub-word line driver commonly connected to a lower word line of the plurality of lower word lines and the corresponding upper word line of the plurality of upper word lines, wherein the sub-word line driver is suitable for selecting at least one of the lower word line and the upper word line.

5. The stacked memory device of claim 1, further comprising:
a semiconductor substrate positioned under the plurality of the lower word lines; and
a peripheral circuit region positioned between the semiconductor substrate and the plurality of the lower word lines,
wherein the peripheral circuit region comprises a plurality of sub-word line drivers configured to select word lines from among the plurality of lower word lines and the plurality of upper word lines.

6. The stacked memory device of claim 1,
wherein each transistors of the lower and upper memory cells comprises:
a pillar extending a third direction from the bit line;
a drain formed in a first portion of the pillar adjacent to the bit line; and
a source formed in a second portion of the pillar adjacent to a corresponding capacitor,
wherein the gate is formed to surround the pillar between the first portion and the second portion which face each other.

7. The stacked memory device of claim 6,
wherein the transistor including the first distance is arranged adjacent to the transistor including the second distance in the first, second and third directions.

8. The stacked memory device of claim 1,
wherein at least one of transistors for forming the plurality of lower memory cells includes the first distance and remaining transistors for forming the plurality of lower memory cells include the second distance, and
wherein at least one of transistors for forming the plurality of upper memory cells includes the first distance and remaining transistors for forming the plurality of upper memory cells include the second distance.

9. The stacked memory device of claim 8,
wherein the transistors for forming the plurality of lower memory cells include odd lower transistors and even lower transistors which are alternately arranged,
wherein the gates of the odd lower transistors are spaced apart from the bit line by the first distance; and
wherein the gates of the even lower transistors are spaced apart from the bit line by the second distance.

10. The stacked memory device of claim 9,
wherein the transistors for forming the plurality of upper memory cells include odd upper transistors and even upper transistors, the odd upper transistors faces the odd lower transistors, respectively and the even upper transistors faces the even lower transistors, respectively
wherein the gates of the odd upper transistors are spaced from the bit line by the second distance; and
wherein the gates of the even upper transistors are spaced from the bit line by the first distance.

11. A stacked memory device comprising:
a first memory array layer; and
a second memory array layer stacked on the first memory array layer along a vertical direction,
wherein each of the first and second memory array layers includes a bit line, a plurality of lower memory cells arranged under the bit line, and a plurality of upper memory cells arranged over the bit line,
wherein each of the plurality of lower memory cells and the plurality of upper memory cells includes a transistor with a drain, a source and a gate, and a capacitor connected to the transistor, and wherein a first transistor of the lower memory cells of at least one of first and second memory array layers includes a first drain length and a second transistor of the lower memory cells of at least one of the first and second memory array layers includes a second drain length different from the first drain length.

12. The stacked memory device of claim 11, wherein the lower memory cells of the first and second memory array layers further comprise a plurality of lower word lines arranged under the bit line of each of the first and second memory array layers and connected to the transistors for the plurality of lower memory cells, respectively; and wherein the upper memory cells of the first and second memory array layers further comprise a plurality of upper word lines arranged over the bit line of each first and second memory array layers and connected to the transistors for the plurality of upper memory cells, respectively.

13. The stacked memory device of claim 11, wherein the plurality of lower memory cells and the plurality of upper memory cells of the first and second memory array layers face each other based on the bit line positioned in each of the first and second memory array layers.

14. The stacked memory device of claim 11, further comprising a control circuit connected to the plurality of lower memory cells and the plurality of upper memory cells of the first and second memory array layers, wherein any one of the lower and upper memory cells of the first and second memory cell array layers is selected by the control circuit.

15. The stacked memory device of claim 11, further comprising a control circuit connected to the plurality of lower memory cells and the plurality of upper memory cells of the first and second memory array layers, wherein the upper and lower memory cells, which face each other based on the bit line positioned in each of the first and second memory array layers of the first and second memory array layers are simultaneously selected by the control circuit.

16. The stacked memory device of claim 11, wherein each of the transistors included in the first and second memory array layers comprises:

a pillar extending along the vertical direction, wherein the drain is formed in a first portion of the pillar adjacent to the bit line, the source is formed in a second portion of the pillar adjacent to the capacitor, and the gate is formed to surround the pillar between the first portion and the second portion which face each other in the vertical direction.

17. The stacked memory device of claim 11, wherein a third transistor of the upper memory cells of at least one of the first and second memory array layers includes the second drain length and a fourth transistor of the upper memory cells of at least one of the first and second memory array layers includes the first drain length, and wherein the third transistor and the first transistor of a memory array layer face each other, and the fourth transistor and the second transistor of a memory array layer face each other.

18. The stack memory device of claim 17, wherein the first transistor is arranged adjacent to the second transistor in a word line extension direction or a bit line extension direction, and the third transistor is arranged adjacent to the fourth transistor, in a word line extension direction or a bit line extension direction.

19. The stacked memory device of claim 11, further comprising:

a plurality of additional transistors connected to each of the plurality of lower and upper word lines, and an additional transistor of the plurality of additional transistors which is connected to a selected one of the plurality of lower and upper word lines includes the first drain length and another additional transistor of the plurality of additional switching transistors which is connected to the selected one of the plurality of lower and upper word lines includes the second drain length.

20. A stack memory device, comprising:

a first word line extending to a first direction;

a first bit line stacked over the first word line, extending a second direction perpendicular to the first direction;

a second word line stacked over the first bit line to overlap the first word line;

a first memory cell including a first switching transistor and a first capacitor, the first switching transistor with a first gate electrically connected to the first word line, a first drain electrically connected to the first bit line, and a first source electrically connected to the first capacitor; and a second memory cell including a second switching transistor and a second capacitor, the second switching transistor with a second gate electrically connected to the second word line, a second drain electrically connected to the first bit line, and a second source electrically connected to the second capacitor, wherein a length of the first drain is different from a length of the second drain.

* * * * *